United States Patent [19]
Matsuzaki

[11] Patent Number: 5,434,824
[45] Date of Patent: Jul. 18, 1995

[54] SEMICONDUCTOR MEMORY DEVICE WITH REDUCED POWER CONSUMPTION AND RELIABLE READ MODE OPERATION

[75] Inventor: Yasuro Matsuzaki, Kawasaki, Japan
[73] Assignee: Fujitsu Limited, Kawasaki, Japan
[21] Appl. No.: 268,573
[22] Filed: Jul. 6, 1994
[51] Int. Cl.⁶ .............................................. G11C 7/00
[52] U.S. Cl. ............................ 365/233.5; 365/189.07
[58] Field of Search ................ 365/233, 233.5, 189.07, 365/189.05

[56] References Cited

U.S. PATENT DOCUMENTS 4,959,816  9/1990  Iwahashi et al. .................. 365/233.5
4,972,374  11/1990  Wang et al. ....................... 365/233.5

*Primary Examiner*—Joseph A. Popek
*Attorney, Agent, or Firm*—Nikaido, Marmelstein, Murray & Oram

[57] ABSTRACT

A semiconductor memory device includes a memory cell array formed of a plurality of memory cells, a peripheral circuit supplied with address signals for selecting a memory cell in the memory cell array, the peripheral circuit further conducting a reading of the content of information stored in the selected memory cell and producing an output indicative thereof, and an address transition detection circuit for detecting a transition in any of the address signals and further for detecting a transition of the output of the peripheral circuit, wherein the address transition detection circuit activates the peripheral circuit when a transition has occurred in any of the address signals and the output of the peripheral circuit.

8 Claims, 7 Drawing Sheets

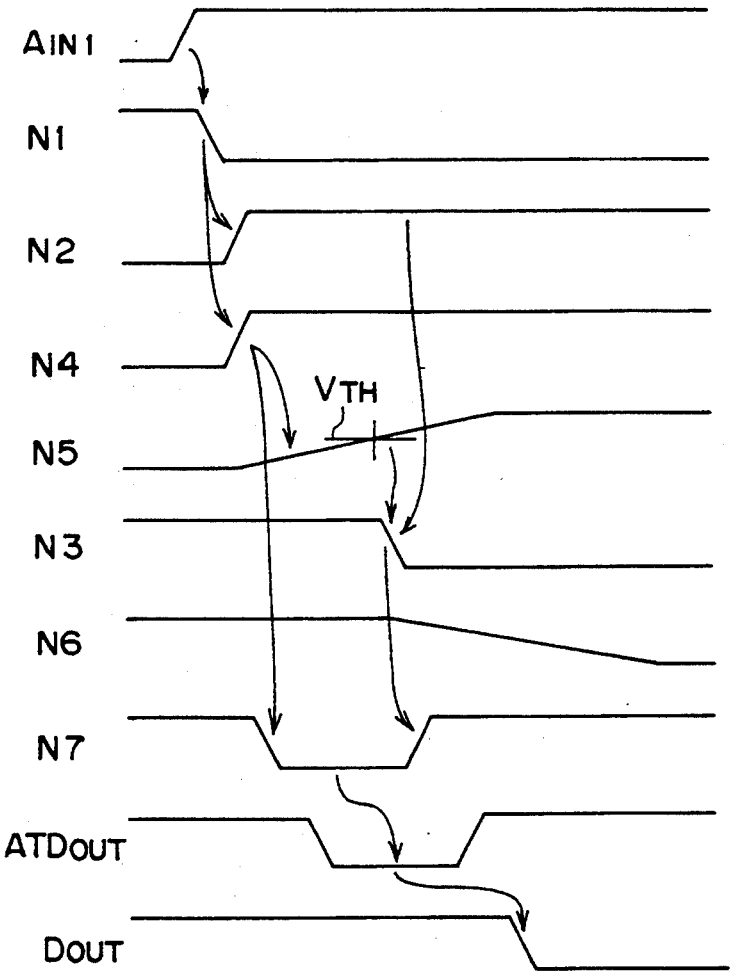

FIG. 4A  AIN1 
FIG. 4B  N1 
FIG. 4C  N2 
FIG. 4D  N4 
FIG. 4E  N5 
FIG. 4F  N3 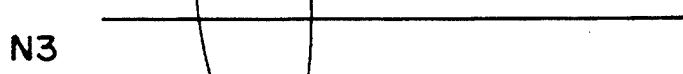
FIG. 4G  N6 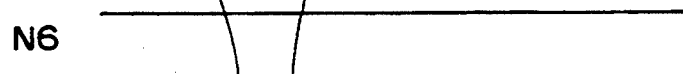
FIG. 4H  N7 
FIG. 4I  ATDOUT 
FIG. 4J  DOUT 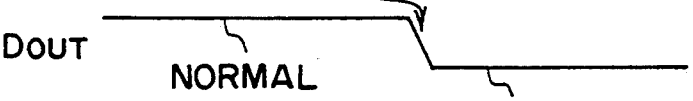
NORMAL          ERROR

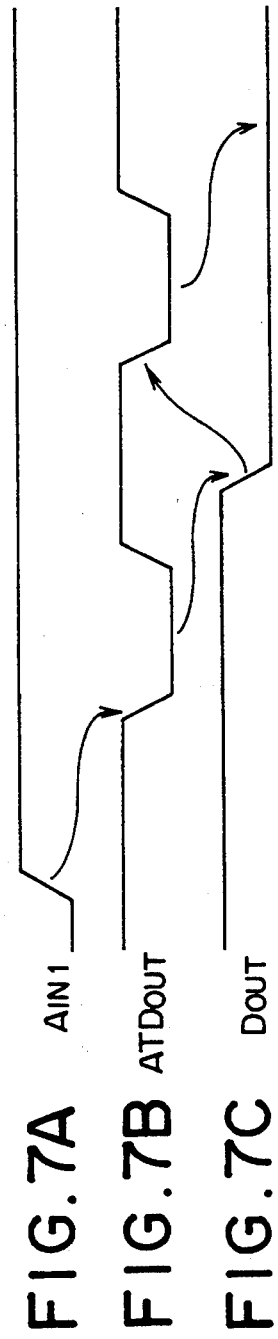
FIG.7A AIN1
FIG.7B ATDOUT
FIG.7C DOUT

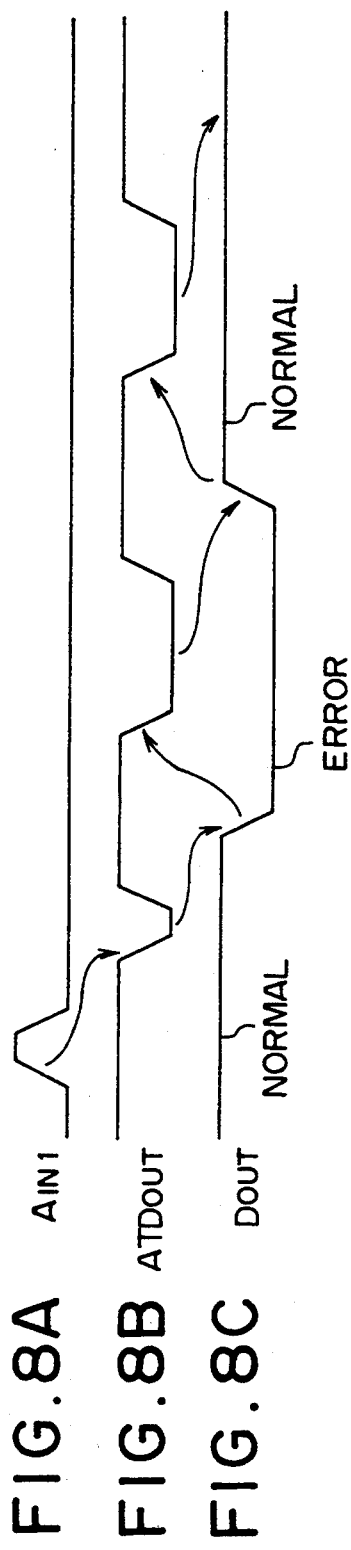

SEMICONDUCTOR MEMORY DEVICE WITH REDUCED POWER CONSUMPTION AND RELIABLE READ MODE OPERATION

BACKGROUND OF THE INVENTION

The present invention generally relates to semiconductor devices and more particularly to a semiconductor memory device using address transition detection for controlling the power consumption of the memory device.

In the semiconductor memory devices, reduction of electric power consumption is an important target. Thus, static random access memories (SRAMs) as well as dynamic random access memories (DRAMs) use address transition detection (ATD) technology such that peripheral circuits in the chip, such as sense amplifiers, word drivers, and the like, are activated only when a transition has occurred in the address signal. By employing such an ATD technology, one can deactivate many peripheral circuits when no transition occurs in the address signal.

FIG. 1 shows a conventional SRAM that uses such an ATD circuit.

Referring to FIG. 1, the SRAM has a chip 1 in which a memory cell array 2 is provided, wherein the memory cell array 2 includes a plurality of memory cells $2a$ arranged in rows and columns. As usual, the memory cells $2a$ are selected by selecting a corresponding word line WL and a bit line BL.

In addition to the memory cell array 2, the chip 1 includes various peripheral circuits, such as an address buffer circuit 3 for receiving address signals $A_{IN1}-A_{IN8}$ supplied externally, a word line driver 4 for decoding row address signals included in the address signals $A_{IN1}-A_{IN8}$ and for selecting a word line WL specified by the row address signals, and a column switch circuit 5 for decoding column address signals included in the address signals $A_{IN1}-A_{IN8}$ and for selecting a bit line BL specified by the column address signals.

Further, the chip 1 includes a sense amplifier 6 for amplifying the data read out from the selected memory cell $2a$ in the memory cell array 2 via the column switch 5 and an output buffer circuit 7 for producing output data $D_{OUT}$ by latching the output of the sense amplifier 6.

In addition, there is provided an ATD circuit 8 in the chip 1 for detecting the transition of the address signals $A_{IN1}-A_{IN8}$, wherein the ATD circuit 8 controls the activation of the word driver 4 and the sense amplifier 6 based upon the detection of transition in the address signals $A_{IN1}-A_{IN8}$. More specifically, the ATD circuit 8 of the SRAM of FIG. 5 produces an output signal $ATD_{OUT}$ such that the word driver 4 and the sense amplifier 5 are deactivated as long as the output signal $ATD_{OUT}$ is stationary and activated only when the output signal $ATD_{OUT}$ has caused transition.

FIG. 2 shows the construction of the ATD circuit 8.

Referring to FIG. 2, the reference numerals 9–16 designate address input terminals supplied with the address signals $A_{IN1}-A_{IN8}$, and the address signals $A_{IN1}-A_{IN8}$ thus received are supplied to corresponding detection circuits 17–24 for detection of address transition. It should be noted that each of the detection circuits 17–24 has an identical construction shown in FIG. 6 and includes inverters 25 and 26 connected in series and NAND gates 27–29 forming a flip-flop circuit together with resistors 30 and 31, wherein the output of the inverter 25 is supplied to the NAND gate 38 while the output of the inverter 26 is supplied to the NAND gate 27. Further, capacitors 32 and 33 cooperate with the resistors 30 and 31 in the flip-flop circuit to form a CR circuit. Further, the output of the flip-flop circuit is obtained via a NAND gate 29.

In the illustrated construction of FIG. 2, the output signals of the detection circuits 17–19 are supplied to a NAND gate 34. Similarly, the output signals of the detection circuits 20–22 are supplied to a NAND gate 35, and the output signals of the detection circuits 23 and 24 are supplied to a NAND gate 36. Further, the output signals of the NAND gates 34–36 are supplied to a NOR gate 37 that produces the aforementioned ATD output signal $ATD_{OUT}$. As already noted, the output signal $ATD_{OUT}$ controls the word driver 4 and the sense amplifier 6. It should be noted that the NAND gates 34–36 and a NOR gate 37 form an OR gate as a whole.

FIGS. 3A–3J are diagrams showing the waveform for explaining the operation of the SRAM of FIG. 1.

Referring to the drawings, FIG. 3A shows the waveform of the address signal $A_{IN1}$ supplied to the input terminal 9 while FIG. 3B shows the waveform of the output signal of the inverter 25 at a node $N_1$. Further, FIG. 3C shows the waveform of the output signal of the inverter 26 at a node $N_2$.

FIG. 3D, on the other hand, shows the waveform of the output signal of the NAND circuit 28 obtained at a node $N_4$ while FIG. 3E shows the voltage level of a node $N_5$ at which the resistor 30 and the capacitor 32 are connected. Similarly, FIG. 3F shows the waveform of the output signal of the NAND circuit obtained at a node $N_3$ while FIG. 3G shows the voltage level of a node $N_6$ at which the resistor 31 and the capacitor 33 are connected.

FIG. 3H, on the other hand, shows the waveform of the output signal of the detection circuit 17, FIG. 3I shows the waveform of the output signal $ATD_{OUT}$ obtained at the ATD circuit 8, and FIG. 3J shows the waveform of the output signal $D_{OUT}$ produced by the output buffer circuit 7. It should be noted that the nodes $N_1-N_6$ are shown in the circuit diagram of FIG. 2.

Thus, in the case that the address signal $A_{IN1}$ is stabilized at a low level state, it will be noted that the node $N_1$ assumes a high level state, the node $N_2$ assumes a low level state, the node $N_3$ and the node $N_6$ assume a high level state, the node $N_4$ and the node $N_5$ assume a low level state, and the node $N_7$ assumes a high level state.

In the case that the address signal $A_{IN1}$ has caused a transition to a high level state and stabilized at such a high level state, on the other hand, the node $N_1$ assumes a low level state, the node $N_2$ assumes a high level state, the node $N_4$ and the node $N_5$ assume a high level state, and the node $N_3$ and the node $N_6$ assume a low level state. Further, the node $N_7$ assumes a high level state. It should be noted that the high level state of the node $N_7$ occurs similarly to the case when the address signal $A_{IN1}$ is stabilized at the low level state.

Thus, as long as there occurs no transition in the address signals $A_{IN1}-A_{IN8}$, it should be noted that the transition detection circuits 17–24 produce high level output signals and the NAND circuits 34–36 produce low level output signals in response thereto. Thereby, the ATD output signal $ATD_{OUT}$ is held at the high level state, and both of the word drivers 4 and the sense amplifiers 6 are the deactivated. In other words, no reading of data is made from the memory cell.

When the address signal $A_{IN1}$ goes high as indicated in FIG. 3A, on the other hand, the node $N_1$ goes low, the node $N_2$ goes high, and the node $N_4$ goes high. As a result, the level of the node $N_5$ increases gradually from the low level state to the high level state in accordance with the time constant of the CR circuit in the flip-flop circuit. Further, the node $N_7$ goes low. When the node $N_7$ goes low, the output signal of the NAND circuit 34 goes high and the ATD output signal $ATD_{OUT}$ goes low. Thus, the word driver 4 and the sense amplifier 6 are both activated in response to the low level state of the ATD output signal $ATD_{OUT}$, and reading of data is made from the selected memory cell $2a$ in the memory cell array 2. The data thus read out from the selected memory cell $2a$ is then latched at the output buffer circuit 7 as the output data of the memory device.

When the voltage at the node $N_5$ reaches a threshold voltage $VT_H$ of the NAND circuit 27, the node $N_3$ goes low and the level of the node $N_6$ decreases gradually from the high level state to the low level state. Further, the node $N_7$ goes high and the ATD output signal $ATD_{OUT}$ goes high. As a result, the word driver 4 and the sense amplifier 6 are deactivated again in response to the crossing of the level of the node $N_5$ across the threshold $V_{TH}$. On the other hand, the output buffer circuit 7 continues outputting the output data $D_{OUT}$ already latched therein.

Thus, it will be noted that the SRAM of FIG. 1 activates the word driver 4 and the sense amplifier 6 only for a limited duration when the address signals $A_{IN1}$-$A_{IN8}$ have caused a transition, by setting the level of the ATD output signal $ATD_{OUT}$ to the low level state. Only in such a limited duration, the data is read from the memory cell and latched in the output buffer circuit 7. After this, the ATD output signal $ATD_{OUT}$ returns to the high level state and the word driver 4 and the sense amplifier 6 are again deactivated. It should be noted that the time constant of the RC circuit formed by the resistor 30 and the capacitor 32 or by the resistor 31 and the capacitor 33, is set sufficiently large for a stabilized operation of the sense amplifier 6. In other words, the duration in which the word decoder 4 and the sense amplifier 6 are activated is sufficiently long for reading the content of the memory cell with reliability. Thus, the SRAM having the ATD circuit 8 can effectively reduce the power consumption of the semiconductor memory device by limiting the duration in which the word driver 4 and the sense amplifier 6 are activated.

In such a conventional semiconductor memory device that uses ATD technology, it should be noted that there can be a case in which erroneous data is latched in the output buffer circuit 7 when a noise or glitch is superposed to the address signals $A_{IN1}$-$A_{IN8}$. Once such erroneous output data is read out, the data is held continuously in the output buffer circuit 7 until the next reading is made. Such erroneous data may lead the system that uses the semiconductor memory device to a failure.

FIGS. 4A–4J explain such an erroneous reading of data caused by the noise in the address signal. It should be noted that FIGS. 8A–8J correspond to FIGS. 3A–3J. Thus, no description will be given to each of the waveform appearing in FIGS. 8A–8J.

Thus, when a glitch is superposed on the address signal $A_{IN1}$ as indicated in FIG. 4A and the signal $A_{IN1}$ goes high momentarily, the node $N_1$ goes low as indicated in FIG. 4B, the node $N_2$ goes high as indicated in FIG. 4C, and the node $N_4$ goes high as indicated in FIG. 4D. As a result, the level of the node $N_5$ starts to rise from the low level state as indicated in FIG. 4E. Further, the node $N_7$ goes low as indicated in FIG. 4H in response to the transition at the node $N_4$. In response to the transition in the node $N_7$, the ATD output signal $ATD_{OUT}$ goes low as indicated in FIG. 4I. In other words, there occurs an activation of the word decoder 4 and the sense amplifier 6 in response to the noise superposed to the address signal $A_{IN1}$.

It should be noted that the address signal $A_{IN1}$ returns immediately to the low level state after the foregoing momentary transition to the high level state when such a transition is caused by a noise impulse or glitch. As a result, the node $N_1$ returns immediately to the high level state. Similarly, the node $N_2$ returns to the low level state and the node $N_4$ returns to the low level state. Thus, the level of the node $N_5$ never reaches the threshold voltage $V_H$ of the NAND circuit 27 but returns again to the low level state as indicated in FIG. 4E. Thus, the node $N_3$ and hence the node $N_6$ maintain the high level state as indicated in FIGS. 4F and 4G. As the node $N_4$ returns immediately to the low level state in the present situation while the node $N_3$ being held at the high level state, the node $N_7$ immediately returns to the high level state in response to the trailing edge of the voltage signal at the node $N_4$ and the ATD output signal $ATD_{OUT}$ also returns immediately to the high level.

Thus, when such a momentary transition occurs in the address signal $A_{IN1}$, the word decoder 4 and the sense amplifier 6 are activated erroneously, while the duration in which the word decoder 4 and the sense amplifier 6 are activated is very short, too short for stabilizing the operation of the word decoder 4 or the sense amplifier 6. Thus, the output buffer circuit 7 holds the erroneous output of the sense amplifier indicative of the memory cell $2a$ selected erroneously by the word decoder 4. When a system cooperating with the SRAM uses the data that is latched in the output buffer circuit 7, therefore, there is a substantial risk that the system hangs or functions erroneously.

SUMMARY OF THE INVENTION

Accordingly, it is a general object of the present invention to provide a novel and useful semiconductor memory device wherein the foregoing problems are eliminated.

Another and more specific object of the present invention is to provide a semiconductor memory device using the ATD technology for reduced power consumption, wherein the memory device is capable of recovering normal data output even when erroneous data output is made as a result of superposition of noise to the address signals.

Another object of the present invention is to provide a semiconductor memory device, comprising:

a memory cell array including a plurality of memory cells, each of said memory cells storing information;

a peripheral circuit supplied with address signals for selecting a memory cell in said memory cell array, said peripheral circuit further reading the content of information stored in said selected memory cell, said peripheral circuit producing an output indicative of the content of the information read out form said selected memory cell; and address transition detection means for detecting a transition in any of said address signals and further for detecting a transition of said output of said peripheral circuit, said address transition detection means activating said peripheral circuit when a transition has occurred in any of said address signals and said output of said peripheral circuit.

According to the present invention, the address transition detection means detects not only the transition of the address signals but also the transition of the output of the peripheral circuit indicative of the content of the information read out from the selected memory cell. Thus, whenever an impulse noise is superposed to one of the address signals, the address transition detection means detects the transition of the address signal and activates the peripheral circuit for reading the content of the selected memory cell. The address thus specified by the address signal containing noise is of course a wrong or erroneous address, and the information thus read out is meaningless and erroneous. Then, the address transition detection means detects the transition in the output of the peripheral circuit, as the reading of such erroneous data inevitably causes a transition in the output of the peripheral circuit. Upon detection of the transition, the address transition detection means once again activates the peripheral circuit and the peripheral circuit reads the content of the memory cell specified by the address signal that is already free from noise. In view of the impulse nature of the noise, it should be noted that the address signals cause erroneous transition only momentarily and immediately return to the normal state. Thus, the content of the information thus read by the peripheral circuit second time is the correct data of the correct address, and the correct data is held in a latch circuit provided in the peripheral circuit.

In the foregoing operation, the address transition detection means further detects the transition of the output of the peripheral circuit as the output changes from erroneous one to the correct one. Thus, the information is read out from the selected memory cell third time, while the content thus obtained third time is identical with the information read out second time. Thus there is no more transition in the output of the peripheral circuit, and the normal, correct output is held in the latch circuit of the peripheral circuit.

Thus, according to the present invention, one can achieve the saving of electric power in the semiconductor memory device by selectively activating the peripheral circuit upon transition of the address signals, while maintaining a reliable reading operation even under existence of impulse noise or glitch.

Other objects and further features of the present invention will become apparent from following detailed description when read in conjunction with the attached drawings.

BRIEF DESCRIPTION OF THE DRAWINGS

FIGS. 3A-3J are waveform diagrams showing the normal operation of the SRAM of FIG. 1;

FIGS. 4A-4J are waveform diagrams showing the operation of the SRAM of FIG. 1 in the case wherein an impulse noise is superposed on the address signals;

FIGS. 7A-7C are waveform diagrams showing the normal operation of the SRAM of the present invention; and FIGS. 8A-8C are waveform diagrams showing the operation of the semiconductor memory device of the present invention in the case wherein an impulse noise is superposed to the address signals.

DETAILED DESCRIPTION OF THE PREFERRED EMBODIMENTS

Figure 5:
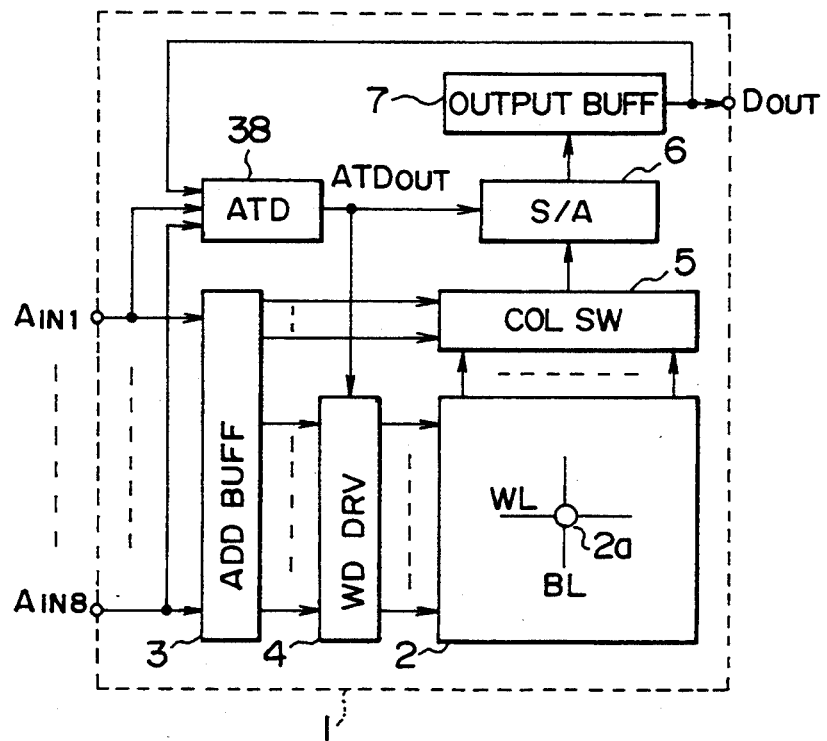
FIG. 5 is a block diagram showing the essential part of an SRAM according to an embodiment of the present invention.

FIG. 5 is a block diagram showing the overall construction of an SRAM according to an embodiment of the present invention.

Figure 1:
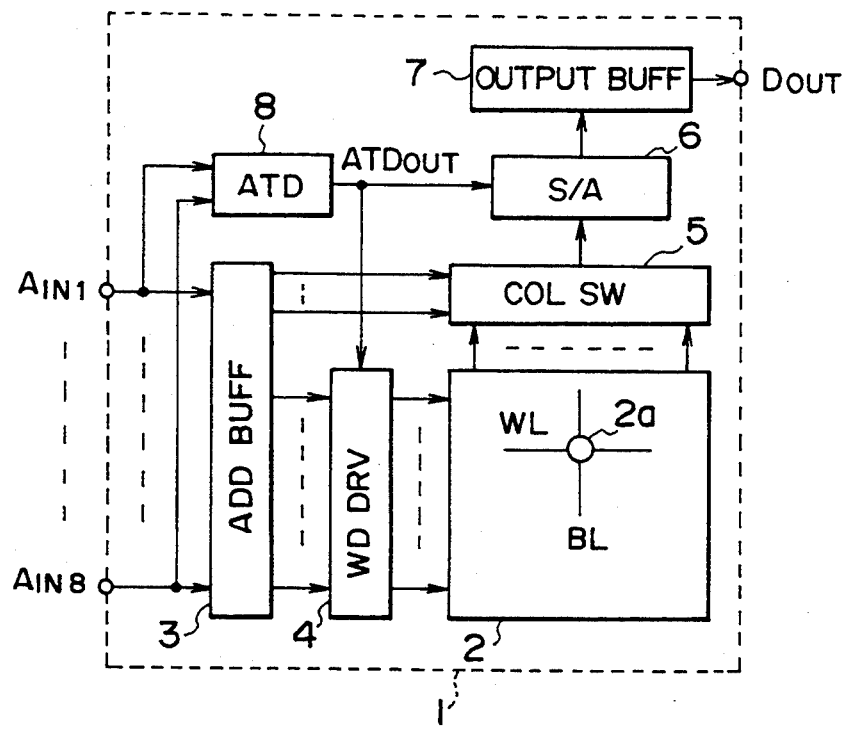
FIG. 1 is a block diagram showing the construction of a conventional SRAM that uses an ATD circuit.

Referring to FIG. 5, the device of FIG. 5 is an improvement of the device of FIG. 1, and those parts corresponding to the parts described previously are designated by the same, corresponding reference numerals.

The SRAM of FIG. 5 has a construction generally identical with the SRAM of FIG. 1 except that an ATD circuit 38 is provided in place of the ATD circuit 8. It should be noted that the ATD circuit 38 controls the word driver 4 and the sense amplifier 6 by way of the ATD output signal $ATD_{OUT}$ not only in response to the address signals $A_{IN1}$–$A_{IN3}$ but also in response to the output $D_{OUT}$ of the output buffer circuit 7.

Figure 6:
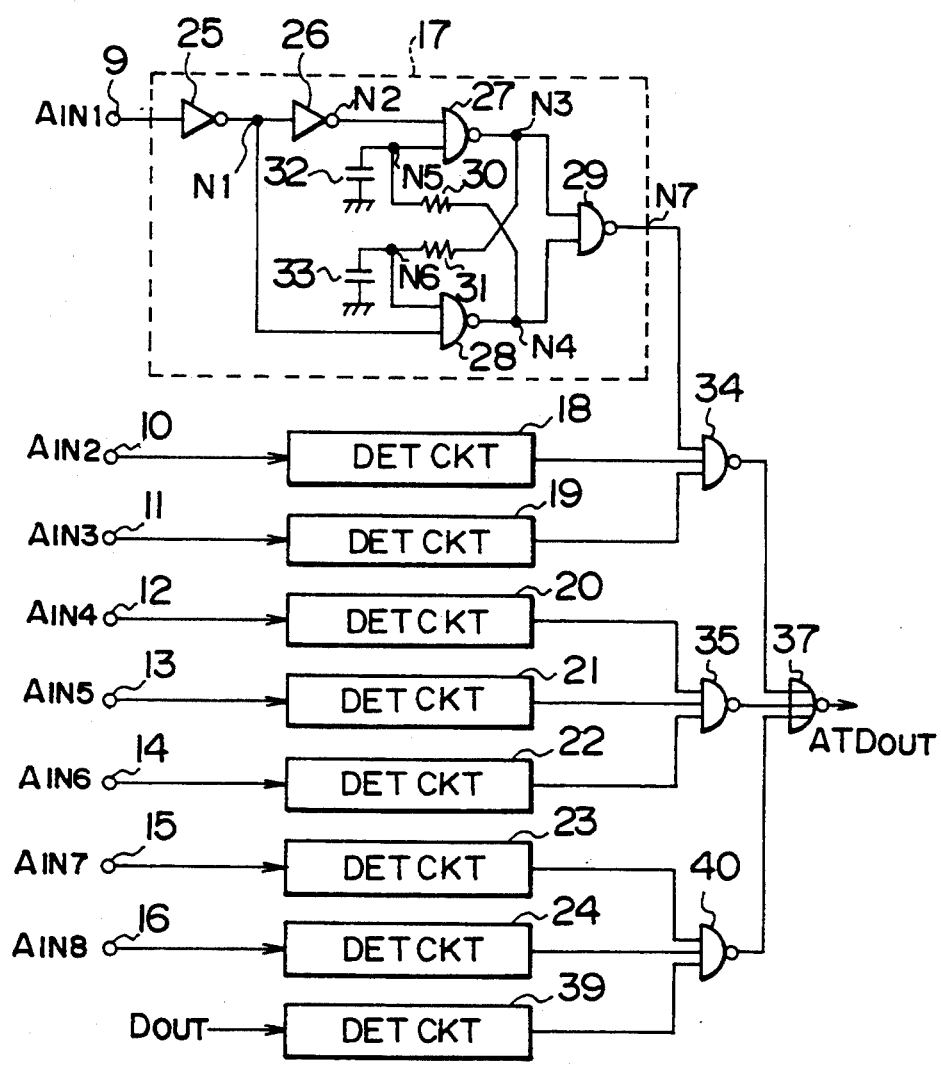
FIG. 6 is a circuit diagram showing the content of an ATD circuit used in the SRAM of FIG. 5.

FIG. 6 shows the construction of the ATD circuit 38.

Referring to FIG. 6, the ATD circuit 38 is an improvement of the ATD circuit 8 of FIG. 6 and includes the transition detection circuits 18–24 for detecting the transition of the address signals $A_{IN1}$–$A_{IN3}$.

Figure 2:
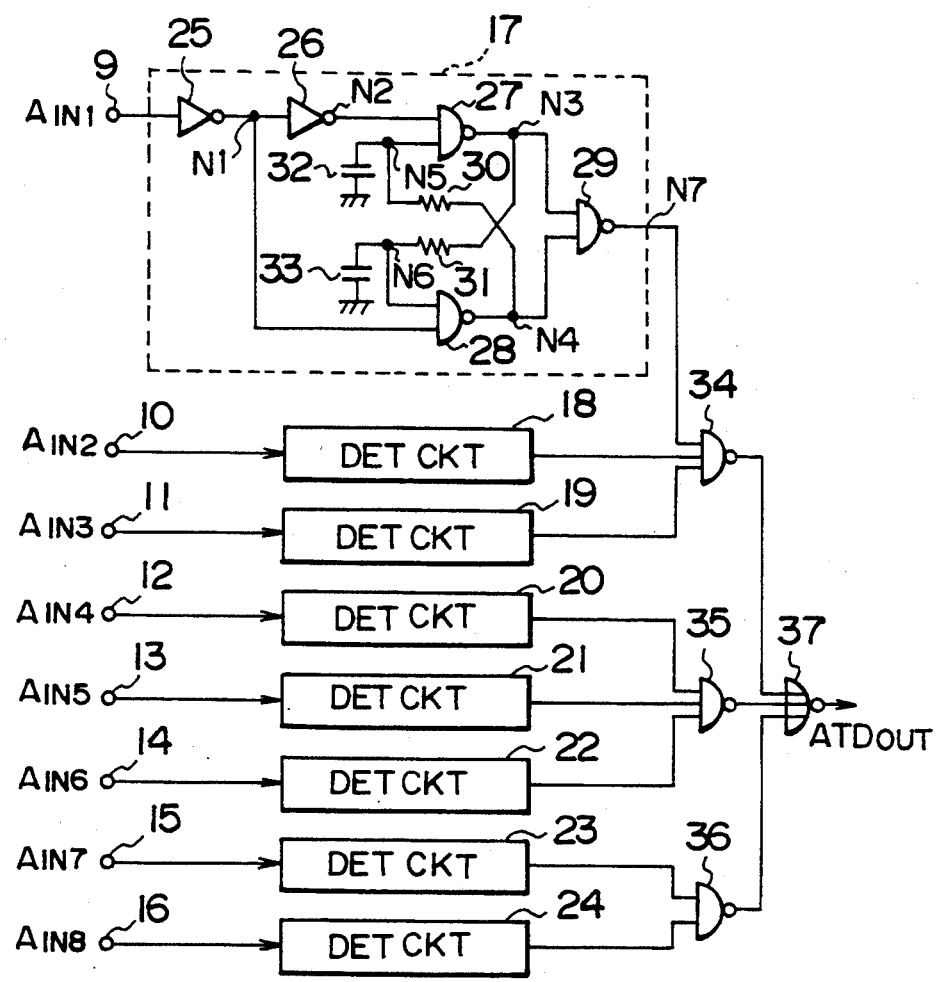
FIG. 2 is a circuit diagram showing the construction of the ATD circuit used in the SRAM of FIG. 1.

In addition, the ATD circuit 38 includes another transition detection circuit 39 for detecting the transition of the output signal $D_{OUT}$ of the output buffer circuit 7, wherein the circuit 39 has a construction identical with the construction of the circuits 18–24. The output of the circuit 39 is processed, together with the outputs of the circuits 23 and 24, by a three-input NAND circuit 40 that replaces the two-input NAND circuit 36 of FIG. 2.

FIGS. 7A-7C are the waveform diagrams for explaining the operation of the present invention for the case in which the address signal $A_{IN1}$ has caused a normal transition. In other words, FIGS. 7A-7C show the normal operation of the SRAM of FIG. 5 in which there is no noise impulse or glitch existing in the address signals such as the address signal $A_{IN1}$.

Referring to FIG. 7A showing a transition of the address signal $A_{IN1}$, the transition of the address signal $A_{IN1}$ triggers the transition of the ATD output signal $ATD_{OUT}$ produced by the ATD circuit 39 as indicated in FIG. 7B, wherein the process that the ATD circuit 39 produces the ATD output signal $ATD_{OUT}$ in response to the transition of the address signal $A_{IN1}$ occurs similarly as explained already with reference to FIGS. 3A-3I. Further, the transition of the signal $ATD_{OUT}$ triggers the transition of the output $D_{OUT}$ of the output buffer circuit 7.

More specifically, the detection circuits 17-24 and 39 produce a high level output when there is no transition in the address signals $A_{IN1}$–$A_{IN3}$, and the NAND circuits 34, 35 and 40 produce a low level output. Thus, the NOR gate 37 produces the output signal $ATD_{OUT}$ at the high level state, and the word driver 4 and the sense amplifier 6 are set to be inactive.

When an address signal such as the address signal $A_{IN1}$ causes a transition from the low level to the high level as indicated in FIG. 7A, the level of the node $N_1$ goes low, the level of the node $N_2$ goes high, the level of the node $N_4$ goes high, and the level of the node $N_5$ goes high gradually across the threshold level $V_H$. In response to the transition of the node $N_4$ to the high level state, the node $N_7$ goes low and the ATD output signal $ATD_{OUT}$ causes a transition to the low level state as indicated in FIG. 7B. Further, upon the crossing of the threshold level $V_{TH}$ at the node $N_5$, the node $N_3$ causes a transition to the low level state and the node 7 returns to the high level state in response to the foregoing transition of the node $N_3$ to the high level state. Thus, the ATD output signal $ATD_{OUT}$ returns to the high level state as indicated in FIG. 3B in response to the transition of the node $N_7$ to the high level state and hence the transition of the node $N_3$ to the high level state. As a result, the word decoder 4 and the sense amplifier 6 are activated in response to the transition of the ATD output signal $ATD_{OUT}$ to the low level state and again deactivated in response to the transition of the ATD output signal $ATD_{OUT}$ to the high level state for saving the electric power. The duration that the signal $ATD_{OUT}$ is low is determined by the time constant of the RC circuit in the transition detection circuit6 17 provided by the resistor 30 and the capacitor 32 or resistor 31 and the capacitor 33, such that the operations of the word decoder 4 and particularly the sense amplifier 6 are stabilized, as already noted. Upon the activation of the word decoder 4 and the sense amplifier 6, the output data is latched by the output buffer circuit 7 as indicated in FIG. 7C.

In the circuit of the present invention, it should be noted that the detection circuit 39 of the ATD detection circuit 38 further detects the transition of the output $D_{OUT}$ of the buffer circuit 7. As a result, the output of the detection circuit 39 goes low similarly to the node $N_7$ of the detection circuit 17. Thus, the output of the NAND circuit 40 cooperating with the detection circuit 39 goes high, and the ATD output $ATD_{OUT}$ goes low for the duration determined by the RC circuit in the detection circuit 39. As a result, the word driver 4 and the sense amplifier 6 are again activated for the duration corresponding to the low level interval of the ATD output signal $ATD_{OUT}$.

In response to the activation of the word driver 4 and the sense amplifier 6, the data is again read out from the selected memory cell 2a and latched in the output buffer circuit 7 as the output data $D_{OUT}$. As the output data $D_{OUT}$ thus read out second time is identical with the output data $D_{OUT}$ first time, there occurs no more transition in the output data $D_{OUT}$, and the output buffer circuit 7 holds the correct output data $D_{OUT}$ stably.

FIGS. 8A–8C shows the operation of the SRAM of FIG. 5 in the case where a glitch is included in the address signal $A_{IN1}$.

Referring to the drawings, the glitch in FIG. 8A is detected by the address transition detection circuit 17 and causes a transition of the ATD output signal $ATD_{OUT}$ to the low level state as indicated in FIG. 8B similarly to the case of FIG. 7B, except that the signal $ATD_{OUT}$ is reset to the original high level state in response to the trailing edge of the glitch in the signal $A_{IN1}$, not by the transition of the voltage at the node $N_3$, as already described with reference to FIGS. 4A–4J. In response to the transition of the signal $ATD_{OUT}$, the word driver 4 and the sense amplifier 6 are activated momentarily for a very short period. Thereby, erroneous data is read out form a wrong memory cell at a wrong address and latched in the output buffer circuit 7 as output data $D_{OUT}$ as indicated in FIG. 8C. It should be noted that the duration that the word driver 4 and the sense amplifier 6 are activated upon the first transition of the signal $ATD_{OUT}$ is too short for stabilizing the operation thereof.

In the present invention, the transition of the output data $D_{OUT}$ shown in FIG. 8C is detected by the transition detection circuit 39 of the ATD detection circuit 38, and the transition detection circuit 39 produces a low level output. In response to the low level output of the detection circuit 39, the NAND gate 40 cooperating with the detection circuit 39 produces a high level output, and the ATD output signal $ATD_{OUT}$ again causes a transition to the low level state as indicated in FIG. 8B.

In this second transition of the signal $ATD_{OUT}$, the glitch in the input address signal $A_{IN1}$ has already vanished, and the ATD output signal $ATD_{OUT}$ thus caused transition returns to the original state in response to the charging of the RC circuit in the transition detection circuit 39 after a sufficiently long duration for stabilizing the operation of the word driver 4 and the sense amplifier 6. Thus, correct data is read out from a correct memory cell 2a in the second transition of the ATD output signal $ATD_{OUT}$ in response to the activation of the word driver 4 and the sense amplifier 6 second time, and the correct data thus read out is held in the output buffer circuit 7 as the output data $D_{OUT}$ as indicated in FIG. 8C. After the ATD output signal $ATD_{OUT}$ has returned to the original high level state, the word decoder 4 and the sense amplifier 6 are deactivated again.

Next, the transition detection circuit 39 again detects the transition of the output data $D_{OUT}$ of the output buffer circuit 7. Thereby, the ATD output signal $ATD_{OUT}$ again causes a third time transition to the low level state as indicated in FIG. 8B, and the correct data is again read out from the correct memory cell 2a as a result of the activation of the word driver 4 and the sense amplifier 6. Again, the duration in which the signal $ATD_{OUT}$ assumes the low level state is determined by the charging of the RC circuit in the transition detection circuit 39, and the word driver 4 and the sense amplifier 6 operate for a duration sufficient for a stabilized operation. The data thus read out is held in the output buffer circuit 7 as the output data $D_{OUT}$. As the correct data $D_{OUT}$ thus held third time in the output buffer circuit 7 is identical with the correct data $D_{OUT}$ held second time in the output buffer circuit 7, there occurs no more transition in the output data $D_{OUT}$ and the output buffer circuit 7 holds the output data $D_{OUT}$ stably as the correct output data.

Thus, according to the present invention, the SRAM can resume the normal operation quickly even when there occurred erroneous operation as a result of noise impulse or glitch.

It should be noted that the present invention is by no means limited to the SRAMs described previously but can be applicable also to DRAMs or any semiconductor memory devices that uses the ATD technology.

Further, the detection circuit 39 of FIG. 6 may operate in response to the output of the sense amplifier 6.

Further, present invention is not limited to the embodiments described heretofore, but various variations and modifications may be made without departing from the scope of the invention.

What is claimed is:

1. A semiconductor memory device, comprising:
   a memory cell array including a plurality of memory cells, each of said memory cells storing information;
   a peripheral circuit supplied with address signals for selecting a memory cell in said memory cell array, said peripheral circuit further reading the content of information stored in said selected memory cell, said peripheral circuit producing an output indicative of the content of the information read out form said selected memory cell; and
   address transition detection means for detecting a transition in any of said address signals and further for detecting a transition of said output of said peripheral circuit, said address transition detection means activating said peripheral circuit when a transition has occurred in any of said address signals and said output of said peripheral circuit.

2. A semiconductor memory device as claimed in claim 1, wherein said address transition detection means comprises: a plurality of address detection circuits provided in correspondence to each of said address signals for detecting a transition thereof, each of said plurality of address detection circuits having an identical construction; an output detection circuit provided for detecting the transition of said output of said peripheral circuit, said output detection circuit having a construction identical with the construction of said address detection circuit; and a logic sum circuit supplied with respective outputs of said plurality of address detection circuits and said output detection circuit for producing a control signal for controlling said peripheral circuit by performing a logic sum operation.

3. A semiconductor memory device as claimed in claim 2, wherein each of said plurality of address detection circuits and said output detection circuit includes a time constant circuit having a time constant sufficiently large for stabilization of operation of said peripheral circuit.

4. A semiconductor memory device as claimed in claim 1, wherein said peripheral circuit includes a word decoder supplied with said address signals for selecting a word line in said memory cell, a column switch supplied with said address signals for selecting a bit line, a sense amplifier for reading the content of the selected memory cell selected by said word decoder and said column switch, and an output buffer circuit for latching an output of said sense amplifier as output data of said semiconductor memory device, wherein said address transition detection means selectively activates said word driver and sense amplifier by producing a control signal upon the transition in any of said address signals and said output of said sense amplifier.

5. A semiconductor memory device as claimed in claim 4, wherein said address transition detection means detects the output of said sense amplifier by detecting the output of said semiconductor memory device latched in said output buffer circuit.

6. A semiconductor memory device as claimed in claim 1, wherein said semiconductor memory device is a static random access memory.

7. A method for operating a semiconductor memory device, said semiconductor memory device being supplied with address signals specifying a selected memory cell for producing output data indicative of the content of information stored in said selected memory cell, comprising the steps of:
   detecting a transition in any of incoming address signals and said output data; and
   activating a process for reading the content of said selected memory cell upon said transition detected by said step of detecting.

8. A semiconductor memory device, comprising:
   a memory cell array including a plurality of memory cells, each of said memory cells storing information; and
   a peripheral circuit supplied with address signals for selecting a memory cell in said memory cell array, said peripheral circuit further reading the content of information stored in said selected memory cell, said peripheral circuit producing an output indicative of the content of the information read out from said selected memory cell;
   said peripheral circuit being activated when a transition has occurred in any of said address signals and said output of said peripheral circuit.

* * * * *

UNITED STATES PATENT AND TRADEMARK OFFICE
CERTIFICATE OF CORRECTION

PATENT NO. : 5,434,824
DATED : July 18, 1995
INVENTOR(S) : Yasuro Matsuzaki

It is certified that error appears in the above-indentified patent and that said Letters Patent is hereby corrected as shown below:

Title page, after line 22, add item:

[30]      Foreign Application Priority Data

July 21, 1993 [JP]    Japan .........5-180500 --.

Signed and Sealed this

Twenty-third Day of January, 1996

Attest:

BRUCE LEHMAN

*Attesting Officer*      *Commissioner of Patents and Trademarks*